United States Patent [19]

Jeong

[11] Patent Number: 6,016,283
[45] Date of Patent: Jan. 18, 2000

[54] MULTIPLE DATA RATE SYNCHRONOUS DRAM FOR ENHANCING DATA TRANSFER SPEED

[75] Inventor: Yong Gwon Jeong, Ichon, Rep. of Korea

[73] Assignee: Hyundai Electronics Industries Co., Ltd., Kyoungki-do, Rep. of Korea

[21] Appl. No.: 09/222,229

[22] Filed: Dec. 29, 1998

[30] Foreign Application Priority Data

Dec. 31, 1997 [KR] Rep. of Korea .................. 97-81267

[51] Int. Cl.[7] ........................................... G11C 8/00
[52] U.S. Cl. ........................... 365/233; 365/189.05
[58] Field of Search .................. 365/233, 189.05, 365/194, 189.01, 191

[56] References Cited

U.S. PATENT DOCUMENTS

| | | | |
|---|---|---|---|
| 5,317,540 | 5/1994 | Furuyama | 365/230.01 |
| 5,345,573 | 9/1994 | Bowden, III et al. | 395/400 |
| 5,384,744 | 1/1995 | Lee | 365/221 |
| 5,473,756 | 12/1995 | Traylor | 395/250 |
| 5,648,931 | 7/1997 | Obara | 365/233 |
| 5,689,213 | 11/1997 | Sher | 331/57 |
| 5,699,530 | 12/1997 | Rust et al. | 395/250 |
| 5,844,844 | 12/1998 | Bauer et al. | 365/189.05 |

FOREIGN PATENT DOCUMENTS 7-282000 10/1995 Japan .

*Primary Examiner*—Son T. Dinh
*Attorney, Agent, or Firm*—Thelen Reid & Priest, LLP

[57] ABSTRACT

The present invention relates to a multiple data rate memory device which has broadened the concept of a double data rate SDRAM. The multiple data rate memory device includes clock signal generator means for receiving an external clock of a frequency f and outputting a plurality of clocks, a frequecy multi-doubler for logically operating the plurality of clocks and outputting an internal clock of a frequency 2Nf (N is natural number); an odd data input buffer for receiving tha data at the rising edge of the internal clock; and an even data input buffer for receiving tha data at the falling edge of the internal clock.

5 Claims, 4 Drawing Sheets

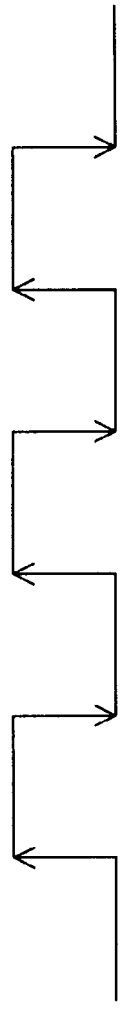
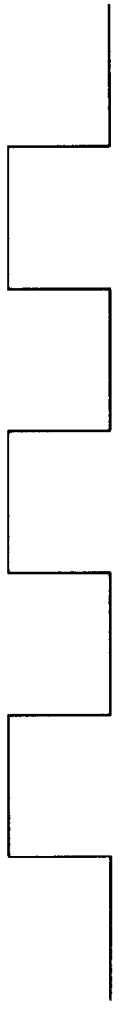
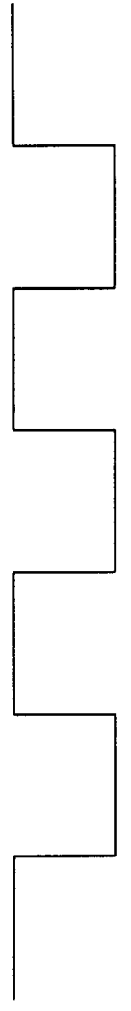
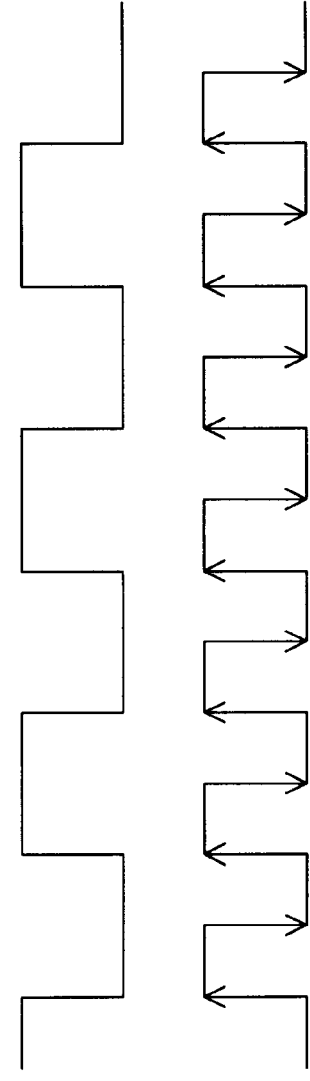
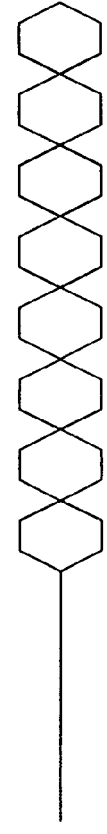
Fig. 4a E_Clk
Fig. 4b /K2
Fig. 4c K2
Fig. 4d K1
Fig. 4e L_Clk
Fig. 4f Data

MULTIPLE DATA RATE SYNCHRONOUS DRAM FOR ENHANCING DATA TRANSFER SPEED

BACKGROUND OF THE INVENTION

1. Field of the Invention

The present invention relates to a multiple data rate memory device which has broadened the concept of the double data rate SDRAM. More particularly, it relates to a multiple data rate SDRAM with improved data speed by providing a frequency doubler which receives an external clock and outputs a plurality of clocks to generate internal system clock.

2. Description of the Prior Art

Conventionally, prior SDRAMs are operated in synchronous with the external clock supplied from the pheriperal control system. The operations of these SDRAMs is activated, generally, at the rising edge of the external clock.

On the other hand, double data rate SDRAMs are activated at both the rising and falling of the external clock, thereby increasing the data processing speed in comparison with that of the general SDRAMs.

FIG. 1A shows block diagram for illustrating the concept of a double data rate SDRAM in accordance with the prior art. It shows, particularly, input buffer part of the double data rate SDRAM.

The input buffer part includes an even data and an odd data input buffer. The even data input buffer transfers input data into the internal circuit of the double data rate SDRAM at the falling edge of the external clock. The odd data input buffer transfers input data into the internal circuit of the double data rate SDRAM at the rising edge of the external clock.

Accordingly, the data processing speed of the double data rate SDRAM is much faster than that of the general SDRAM.

However, the data processing speed of the double data rate SDRAM has only improved twice of that of the general SDRAMs.

SUMMARY OF THE INVENTION

Accordingly, the present invention is directed to a multiple data rate memory device that substantially obviates one or more of the problems due to speed limitations or other disadvantages of the related art.

It is an object of the present invention to provide a multiple data rate SDRAM which has a data processing speed faster than that of the double data rate SDRAM.

The multiple data rate SDRAM of the present invention utilizes the concept used in the double data rate SDRAM.

To achieve the above object, there is provided a multiple data rate memory device for receiving data comprising: a clock signal generator means for receiving an external clock of a frequency f and outputting a plurality of clocks; a frequecy multi-doubler for logically operating the plurality of clocks and outputting an internal clock of a frequency 2Nf (N is natural number); an odd data input buffer for receiving tha data at the rising edge of the internal clock; and an even data input buffer for receiving tha data at the falling edge of the internal clock. Additional features and advantages of the invention will be set forth in the description which follows, and in part will be apparent from the description, or may be learned by practice of the invention.

The objective and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

Further objects and other advantages of the present invention will become apparent from the following description in conjunction with the attached drawings, in which:

FIG. 4 shows a waveform diagram according to the present invention;

DETAILED DESCRIPTION OF THE PREFERRED EMBODIMENTS

A preferred embodiment of the present invention will now be described in detail with reference to the accompanying drawings.

Figure 1A:
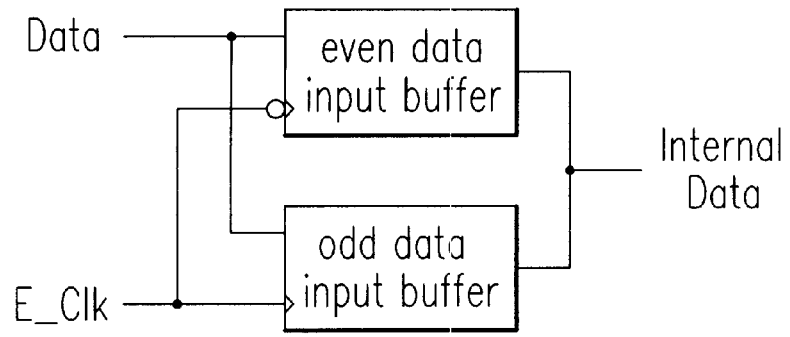
FIG. 1A shows block diagram for illustrating the concept of a double data rate SDRAM in accordance with the prior art.
Figure 1B:
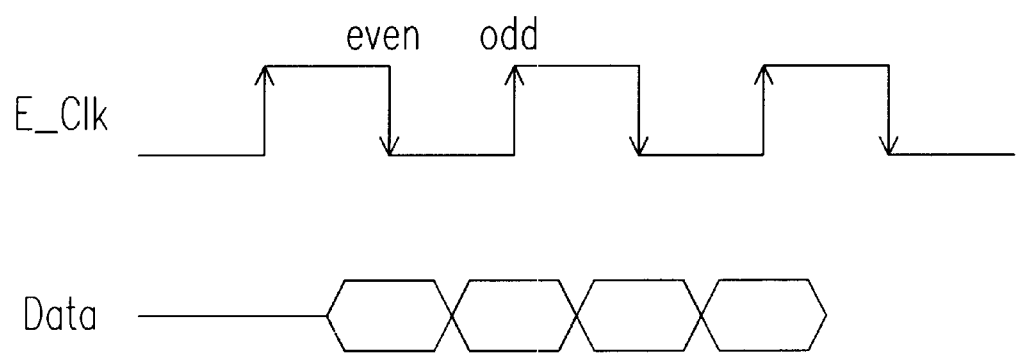
FIG. 1B shows a waveform diagram according to the operation of FIG. 1.
Figure 2:
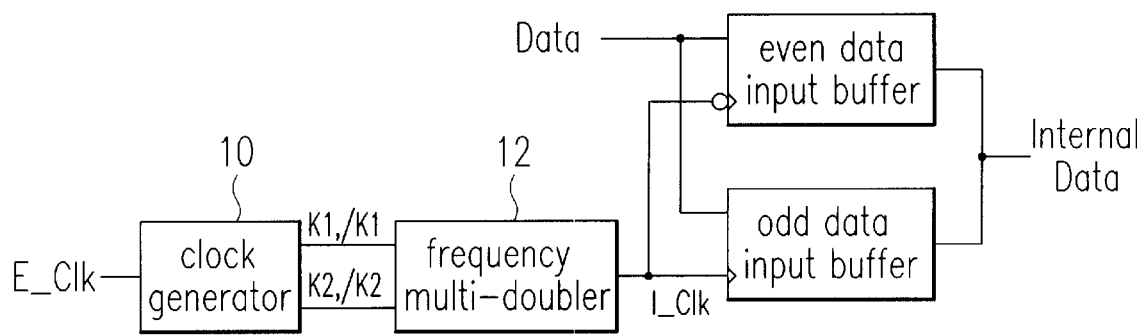
FIG. 2 shows block diagram for illustrating the concept of a multiple data rate SDRAM in accordance with the present invention.

FIG. 2 is one embodiment that shows the concept of a multiple data rate SDRAM in accordance with the present invention.

It shows, particularly, input buffer part of the mutiple data rate SDRAM.

In FIG. 2, the input buffer part includes a clock signal generator 10, a frequency doubler 12, an even and an odd data input buffer.

The clock signal generator 10 receives an external clock and generates two clocks K1 and K2. The phase difference between the clock K1 and clock K2 may be 90 degree. The clocks K1 and K2 are inputted into the frequency multi-doubler 12 by which the two clocks may be logically processed. Thereafter, the frequency multi-doubler 12 may generate an internal clock I_clk. The frequency of the internal clock I_clk is higher than that of the external clock E_clk. The preferred frequency of the internal clock I_clk is double the frequency of the external clock E_clk. The internal clock I_clk is inputted both to the even and odd data input buffer. The even data input buffer may be activated at the falling edge of the internal clock; the odd data input buffer may be activated at the rising edge of the internal clock; and vice versa.

The even data input buffer may transfer input data into the internal circuit of the multiple data rate SDRAM at the time of the falling edge of the external clock. The odd data input buffer may transfer input data into the internal circuit of the multiple data rate SDRAM at the rising edge of the external clock.

Figure 3:
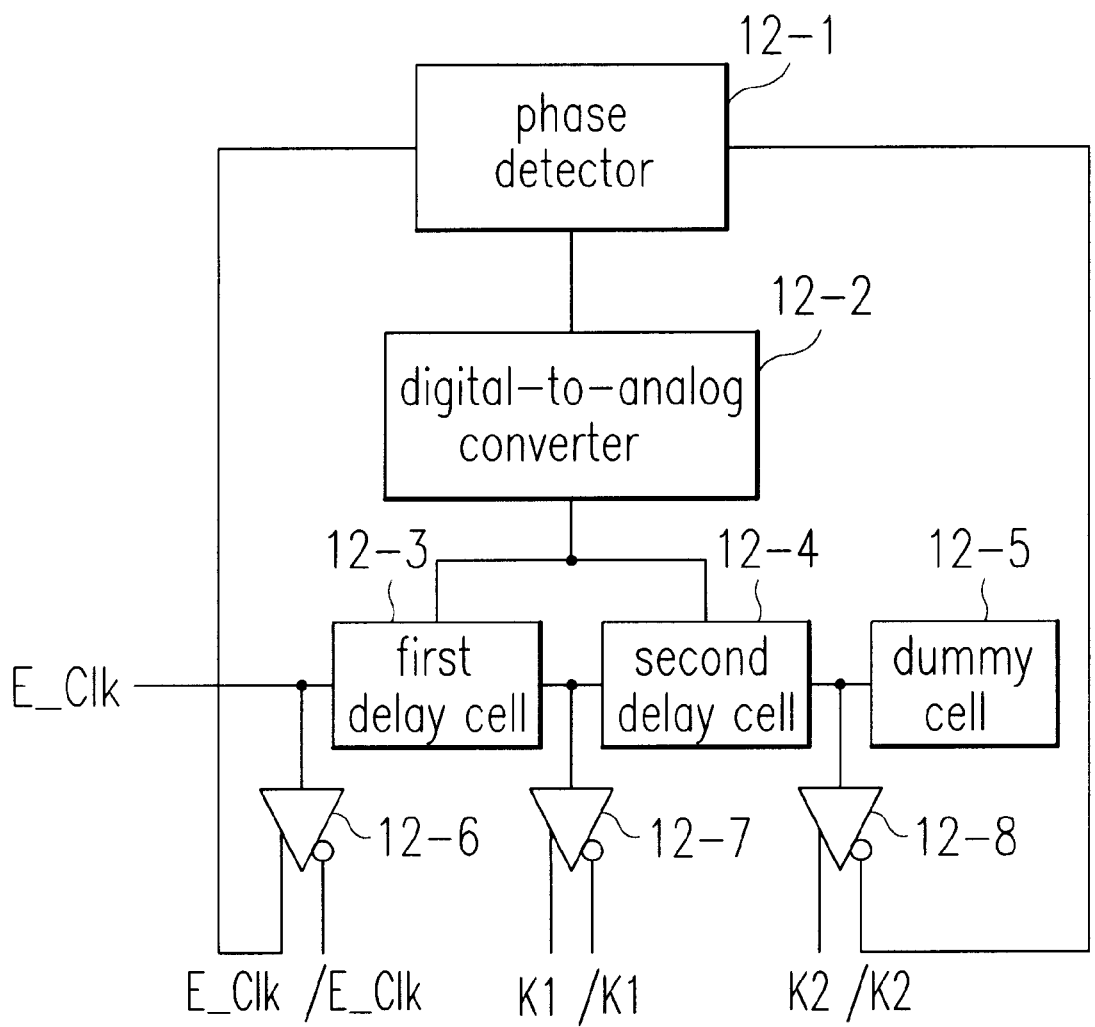
FIG. 3 shows an embodiment of a clock signal generator as shown in FIG. 2.

A detailed description about the operation of the clock signal generator will now be explained below with reference to FIG. 3 which shows an embodiment of a clock signal generator shown in FIG. 2.

The first delay cell 12-3 receives the external clock and outputs the delayed external clock. The second delay cell 12-4 receives the output of the first delay cell 12-3. The dummy cell 12-5 is coupled with the output terminal of the second delay cell 12-4 in order to adjust the fanout condition. The first inverting/non-inverting buffer 12-6 receives the external clock and outputs a delayed external clock and an inverted delayed external clock. The second inverting/non-inverting buffer 12-7 receives an output signal from the first delay cell 12-3 and outputs signals K1 and /K1. The signal K1 is a delayed signal of the output signal from the first delay cell 12-3. The signal /K1 is an inverted signal of the signal K1. The third inverting/non-inverting buffer 12-8 receives output signal from the second delay cell 12-4 and outputs signals K2 and /K2. The signal K2 is a delayed signal of the output signal from the second delay cell 12-4. The signal /K2 is an inverted signal of the signal K2. The phase detector 12-1 receives and compares both the signal /K2 and the delayed external clock. The phase detector 12-1 outputs a digital signal in response to the phase difference between the signal /K2 and the delayed external clock. The digital-to-analog converter 12-2 applies a certain analog signal both to the first and the second delay cells to control the phase difference in response to the digital signal from the phase detector 12-1.

As explained above, the first delay cell 12-3 receives the external clock and the second delay cell 12-4 receives the output from the first delay cell 12-3. The first delay cell 12-3 and the second delay cell 12-4 delay the external clock E_clk in response to the output signal from the digital-to-analog converter 12-2.

The output signal from the digital-to-analog converter is simultaneously inputted both to the first delay cell 12-3 and second delay cell 12-4.

The delayed external clock which is outputted from the first inverting/non-inverting buffer 12-6 and signal /K2 which is outputted from the third inverting/non-inverting buffer 12-8 are inputted to the phase detector 12-1, which compares the phases of the two signals and outputs a certain output signal in accordance with the difference of the phases.

For example, if the phase of the external clock leads that of the signal /K2, the phase detector 12-1 outputs a level of "High" and inputs it to the digital-to-analog convertor 12-2. The digital-to-analog convertor inputs a certain output signal to the delay cells to reduce the phase difference between the delayed external clock and the signal /K2.

That is, the digital-to-analog convertor which is controlled by the output signal from the phase detector, determines the amount of the phase difference and outputs a certain analog signal to control the delay difference.

FIG. 4 shows a waveform diagram when the phase of the external clock and the phase of the signal /K2 are matched, i.e., phase locked.

FIG. 4a is a waveform of the external clock. FIGS. 4b and 4c show waveforms of output signals /K2 and K2 from the third inverting/non-inverting buffer 12-8. FIG. 4d is a clock signal K1 outputted from the second inverting/non-inverting buffer 12-7. The phase difference between signal K2 and K1 is 90 degrees.

FIG. 4e is an output signal generated from the multi-doubler 12 and also is a internal clock I_clk. The multi-doubler processes the signals K1 and K2 with exclusive-OR operation.

Then, the even data input buffer may be activated at the falling edge of the internal clock, the odd data input buffer may be activated at the rising edge of the internal clock, and vice versa.

FIG. 4f shows data which is outputted at the falling edge and the rising edge of the internal clock.

Accordingly, the data process speed has doubled, since the operating frequency of the internal clock is twice that of the frequency of the prior art.

Although the present invention have generated the internal clock by logically operating two clocks, it is possible to use many clocks in order to broaden the bandwidth of the memory system.

That is, if the number of the delay cells is increased, the number of clocks outputted from each of the delay cells is also increased. Accordingly, it is possible to embody a multiple data rate memory device, wherein the frequency of the internal clock of which may be increased more than two times in comparison with the frequency of the external clock.

Although the present embodiment is explained regarding the data input buffer, the present embodiment may be also applied to the data output buffer.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A multiple data rate memory device for receiving data, comprising:
   a clock signal generator means for receiving an external clock of a frequency f and outputting a plurality of clocks;
   a frequecy multi-doubler for logically operating the plurality of clocks and outputting an internal clock of a frequency 2Nf, N is natural number;
   an odd data input buffer for receiving tha data at the rising edge of the internal clock; and
   an even data input buffer for receiving tha data at the falling edge of the internal clock.

2. A multiple data rate memory device as set forth in claim 1, wherein the clock signal generator means includes:
   first to Nth delay cells for sequentially delay of the external clock;
   a phase detecting means for comparing the phase of the external clock with the phase of the Nth delay cell and detecting the phase difference between the external clock and the Nth delay cell; and
   a digital-to-analog converter means for receiving the digital output signal from the phase detecting means and inputting an analog signal which controls the delay time from the first delay cell to the Nth delay cell into each of the first to Nth delay cells.

3. A multiple data rate memory device as set forth in claim 2, wherein the internal clock is generated by the logic operation of the delay signals which are produced from each of the first to Nth delay cells.

4. A multiple data rate memory device as set forth in claim 2, further comprising:
   first to Nth buffer means each of which receives each of the delay signals outputted from the first to Nth delay cells; and a N+1 buffer means for receiving the external clock;

wherein each of the first to Nth buffer means outputs inverting/non-inverting signal simultaneously, the phase detecting means compares the inverting signal of the Nth buffer means and the noninverting signal of the N+1 buffer means.

5. A multiple data rate memory device as set forth in claim 4, wherein the frequency doubler generates the internal clock by the logic operation of the output signals which are produced from each of the first to Nth buffer means.

* * * * *